(12) United States Patent
Kamo et al.

(10) Patent No.: US 7,960,076 B2
(45) Date of Patent: Jun. 14, 2011

(54) REFLECTIVE-TYPE MASK

(75) Inventors: Takashi Kamo, Yokohama (JP); Osamu Suga, Kokubunji (JP); Toshihiko Tanaka, Tsukuba (JP)

(73) Assignees: Kabushiki Kaisha Toshiba, Tokyo (JP); Renesas Technology Corp., Tokyo (JP)

( * ) Notice: Subject to any disclaimer, the term of this patent is extended or adjusted under 35 U.S.C. 154(b) by 242 days.

(21) Appl. No.: 12/329,126

(22) Filed: Dec. 5, 2008

(65) Prior Publication Data

US 2009/0148781 A1 Jun. 11, 2009

(30) Foreign Application Priority Data

Dec. 7, 2007 (JP) ................................. 2007-317695

(51) Int. Cl.
*G03F 1/00* (2006.01)
(52) U.S. Cl. .......................................................... 430/5
(58) Field of Classification Search .................... 430/5
See application file for complete search history.

(56) References Cited

U.S. PATENT DOCUMENTS

| | | | | |
|---|---|---|---|---|
| 5,897,979 A * | 4/1999 | Tzu et al. | ............................ | 430/5 |
| 2002/0028390 A1 * | 3/2002 | Mazed | ................................ | 430/5 |
| 2004/0131948 A1 * | 7/2004 | Yan | ..................................... | 430/5 |
| 2004/0188383 A1 * | 9/2004 | Lucas et al. | ....................... | 216/54 |
| 2006/0222961 A1 | 10/2006 | Yan | | |
| 2007/0231709 A1 * | 10/2007 | Mickan et al. | ...................... | 430/5 |

FOREIGN PATENT DOCUMENTS

JP 2004-266300 9/2004

OTHER PUBLICATIONS

Takashi Kamo, Hajime Aoyama, Toshihiko Tanaka, Osamu Suga, Tsukasa Abe, Tadahiko Takikawa, Naoya Hayashi, Tsutomu Shoki, Youichi Usui, and Morio Hosoya,"EUVL practical mask structure with light shield area for 32nm half pitch and beyond" Proc. SPIE 7122, 712227 (2008), Online Publication Oct. 17, 2008.*
Takashi Kamo, Hajime Aoyama, Toshihiko Tanaka, and Osamu Suga, "Impact of mask absorber properties on printability in EUV lithography," Proc. SPIE 6730, 673017 (2007), Online Publication Oct. 30, 2007.*
Kamo, et al., "Effects of mask absorber thickness on printability in EUV lithography with high resolution resist", Proc. of SPIE, vol. 7028, pp. R1-R-12, (2008).

* cited by examiner

*Primary Examiner* — Stephen Rosasco
*Assistant Examiner* — Jonathan Jelsma
(74) *Attorney, Agent, or Firm* — Finnegan, Henderson, Farabow, Garrett & Dunner, L.L.P.

(57) ABSTRACT

A reflective-type mask having a main surface including a pattern region in the main surface, the pattern region including a multilayer reflective film which reflects the exposure light and a first absorber pattern on the multilayer reflective film, the first absorber pattern including a pattern which absorbs the exposure light and corresponds to a pattern to be formed on a wafer, a light shielding region in the main surface for preventing a region on the wafer excluding a predetermined region from being irradiated with the exposure light when the main surface is irradiated with the exposure light for transferring the first absorber pattern to the predetermined region, the light shielding region including a second absorber pattern having a lower reflectivity to the exposure light than the first absorber pattern and being provided in a position differing from a position in which the first absorber pattern is provided.

10 Claims, 17 Drawing Sheets

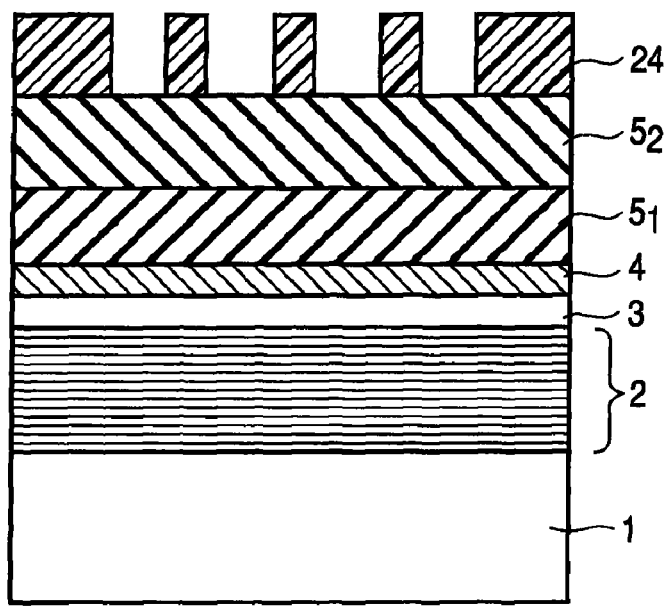
F I G. 24
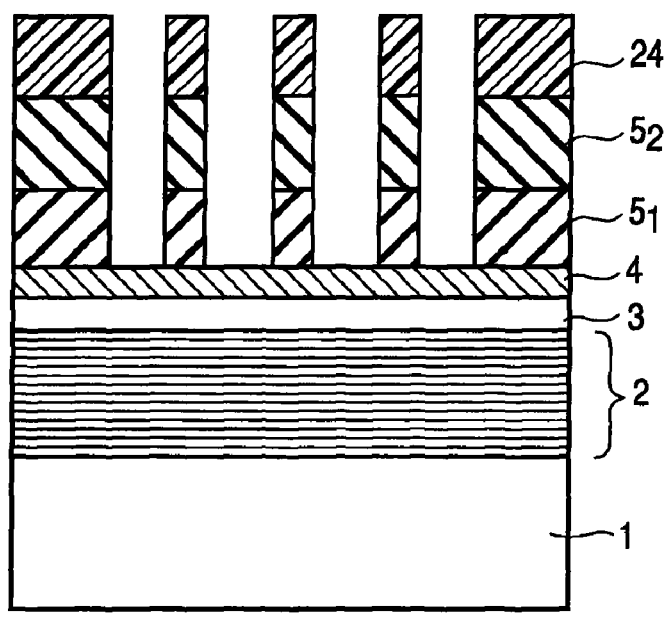
F I G. 25

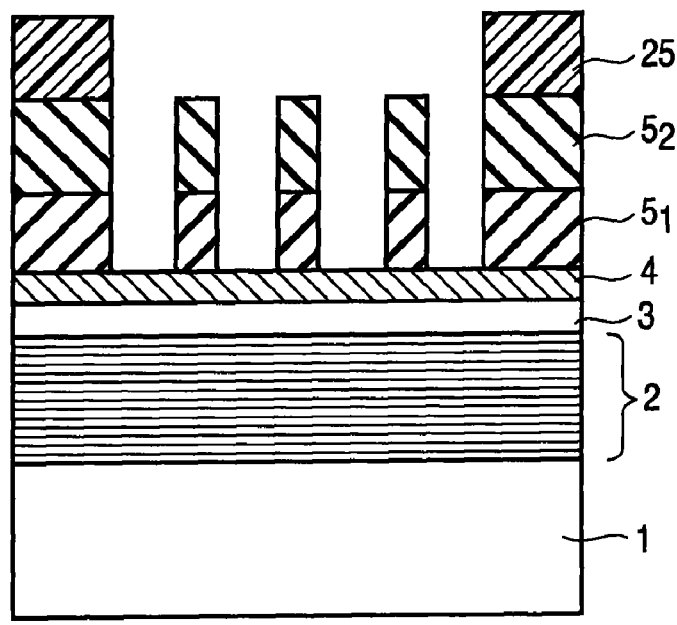
F I G. 26
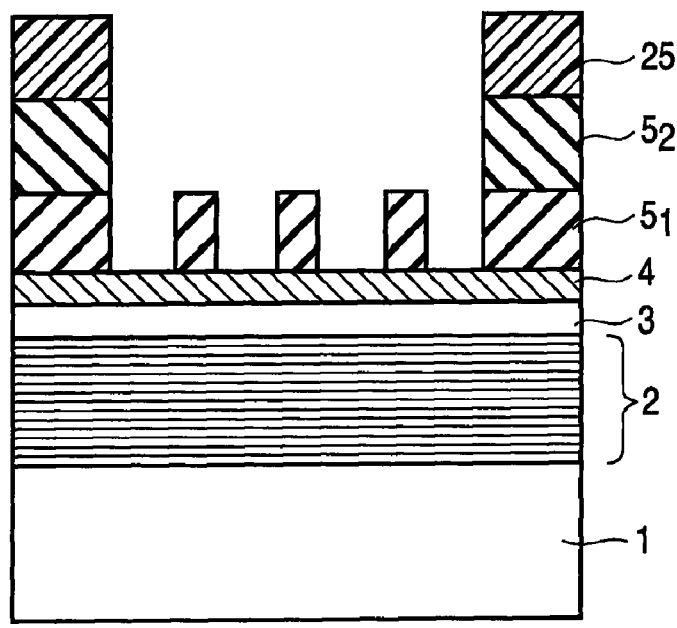
F I G. 27

REFLECTIVE-TYPE MASK

CROSS-REFERENCE TO RELATED APPLICATIONS

This application is based upon and claims the benefit of priority from prior Japanese Patent Application No. 2007-317695, filed Dec. 7, 2007, the entire contents of which are incorporated herein by reference.

BACKGROUND OF THE INVENTION

1. Field of the Invention

This invention relates to a reflective-type mask used in EUV (Extreme Ultra-Violet) exposure.

2. Description of the Related Art

In recent years, the development of EUV exposure technology has been moving forward to miniaturize device elements further (Jpn. Pat. Appln. KOKAI Publication No. 2004-266300). In EUV exposure, a reflective-type mask is used. A reflective-type mask comprises a region (pattern region) including a pattern corresponding to a pattern to be formed on a wafer and a region (light shielding region) which is provided around the pattern region and whose EUV light reflectivity is low. The light shielding region is a region for suppressing leakage of EUV light from a part where adjacent shots overlap.

The pattern region comprises a reflective film which reflects the EUV light and an absorber which is provided on the reflective film and absorbs the EUV light. This absorber has a pattern corresponding to a pattern to be formed on the wafer. The light shielding region comprises an absorber which absorbs the EUV light. This absorber is provided along the periphery of the pattern region. Since the absorbers in the pattern region and the light shielding region are formed by processing the same film, the absorber in the pattern region and that in the light shielding region are made of the same material and have the same thickness. The absorbers typically have a stacked structure comprising a buffer film and an absorption film which absorbs the EUV light.

The absorbers are required to have a mean reflectivity of less than 0.5%. The reason is that, if the mean reflectivity is not sufficiently low, a pattern cannot be formed on a wafer as designed due to the leakage of EUV light from the part where the adjacent shots overlap. That is, the light shielding region cannot perform its function.

To satisfy a mean reflectivity of less than 0.5% using a Cr film as the buffer film and a titanium nitride (TaN) film as the absorption film, the sum of the thickness of the Cr film and that of the TaN film has to be 70 nm or more.

The EUV light is irradiated to the reflective-type mask at an inclination angle of, for example, about six degrees. Thus, if the absorber is relatively thick (70 nm or more) as described above, the shadowing of EUV light occurs in the absorber in the pattern region.

The degree of shadowing effect differs depending on the pattern. FIGS. 39A and 39B show examples. FIG. 39A shows a line and space pattern (L&S pattern) P1 on a reflective-type mask where a direction parallel to the incident direction D of the EUV light is a longitudinal direction. FIG. 39B shows an L&S pattern P2 on the reflective-type mask where a direction perpendicular to the incident direction D of the EUV light is a longitudinal direction. The shadowing effect is greater on the L&S pattern 2 than on the L&S pattern S1. Accordingly, there is a difference in transfer dimensions between the L&S pattern P1 and L&S pattern P2. Moreover, the pattern center position of an exposure transferred image (light intensity distribution) of the L&S pattern P1 deviated from the center position of the L&S pattern P1.

Although the problem resulting from shadowing can be solved by making the absorber thinner, this will increase the mean reflectivity, making it impossible to solve the EUV light leakage problem.

BRIEF SUMMARY OF THE INVENTION

According to an aspect of the present invention, there is provided a reflective-type mask including a main surface to be irradiated with exposure light, comprising: a pattern region provided in the main surface, the pattern region comprising a multilayer reflective film configured to reflect the exposure light and a first absorber pattern provided on the multilayer reflective film, the first absorber pattern including a pattern which is configured to absorb the exposure light and corresponds to a pattern to be formed on a wafer; a light shielding region provided in the main surface and configured to prevent a region on the wafer excluding a predetermined region from being irradiated with the exposure light when the main surface is irradiated with the exposure light for transferring the first absorber pattern to the predetermined region on the wafer, the light shielding region comprising a second absorber pattern, the second absorber pattern having a lower reflectivity to the exposure light than the first absorber pattern and being provided in a position differing from a position in which the first absorber pattern is provided.

BRIEF DESCRIPTION OF THE SEVERAL VIEWS OF THE DRAWING

FIG. 24 is a sectional view showing the process of manufacturing the reflective-type mask of the fourth embodiment following FIG. 23;

FIG. 25 is a sectional view showing the process of manufacturing the reflective-type mask of the fourth embodiment following FIG. 24;

FIG. 26 is a sectional view showing the process of manufacturing the reflective-type mask of the fourth embodiment following FIG. 25;

FIG. 27 is a sectional view showing the process of manufacturing the reflective-type mask of the fourth embodiment following FIG. 26;

DETAILED DESCRIPTION OF THE INVENTION

Hereinafter, referring to the accompanying drawings, embodiments of the invention will be explained.

First Embodiment

A reflective-type mask including a main surface to be irradiated with exposure light of the present embodiment comprises a pattern region provided in the main surface, the pattern region comprising a multilayer reflective film configured to reflect the exposure light and a first absorber pattern provided on the multilayer reflective film, the first absorber pattern including a pattern which is configured to absorb the exposure light and corresponds to a pattern to be formed on a wafer; a light shielding region provided in the main surface and configured to prevent a region on the wafer excluding a predetermined region from being irradiated with the exposure light when the main surface is irradiated with the exposure light for transferring the first absorber pattern to the predetermined region on the wafer, the light shielding region comprising a second absorber pattern, the second absorber pattern having a lower reflectivity to the exposure light than the first absorber pattern and being provided in a position differing from a position in which the first absorber pattern is provided.

Accordingly, even if the first absorber pattern is thinned to the extent that the shadowing effect of exposure light on the pattern region is alleviated, the leakage of exposure light from the part where adjacent shots overlap is suppressed, and the shadowing effect of exposure light can be alleviated by selecting at least one of the thickness and material of the second absorber pattern of the light shielding region so that the leakage of exposure light from the part where adjacent shots overlap is suppressed.

Second Embodiment

Figure 1:
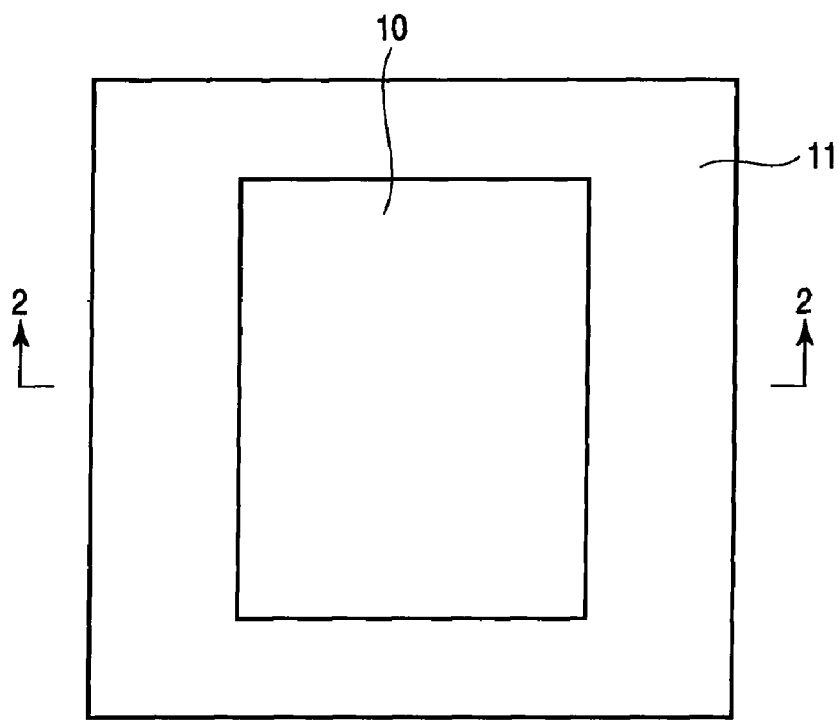
FIG. 1 is a plan view showing a reflective-type mask according to a second embodiment.

FIG. 1 is a plan view showing a reflective-type mask according to a second embodiment.

As shown in FIG. 1, the reflective-type mask comprises a region (transfer pattern region) 10 which includes a pattern corresponding to a pattern to be formed on a wafer and a region (light shielding region) 11 which is provided around the transfer pattern region 10 and absorbs the EUV light. The light shielding region 11 is a region for suppressing the leaking of light from a part where adjacent shots overlap. The reflectivity of the light shielding region 11 is, for example, less than 0.5%. Hereinafter, referring to FIG. 2, the reflective-type mask of the present embodiment will be explained further.

Figure 2:
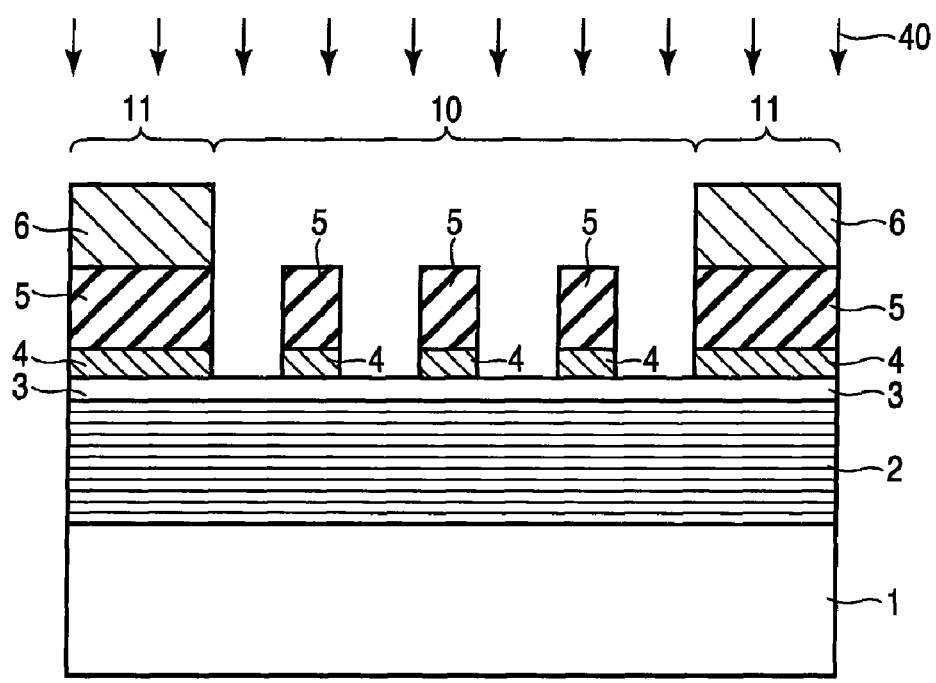
FIG. 2 is a sectional view showing the reflective-type mask taken along line 2-2 of FIG. 1.
Figure 3:
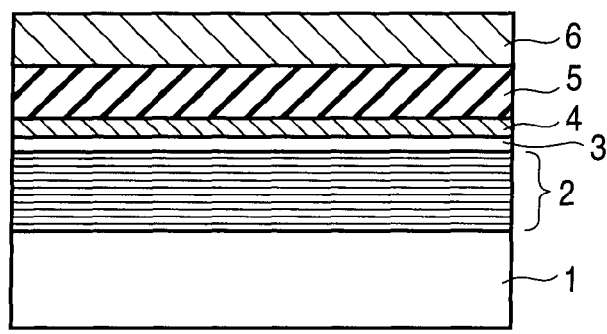
FIG. 3 is a sectional view showing a process of manufacturing a reflective-type mask according to the second embodiment.
Figure 4:
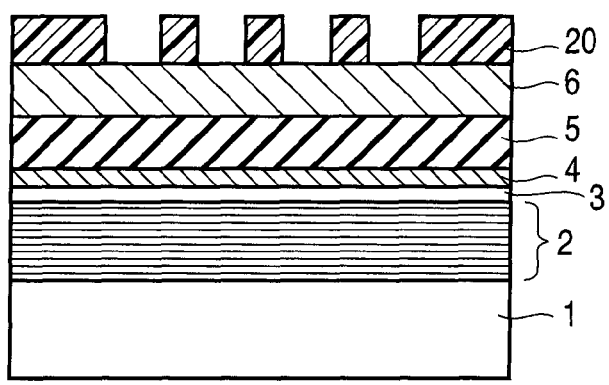
FIG. 4 is a sectional view showing the process of manufacturing the reflective-type mask of the second embodiment following FIG. 3.
Figure 5:
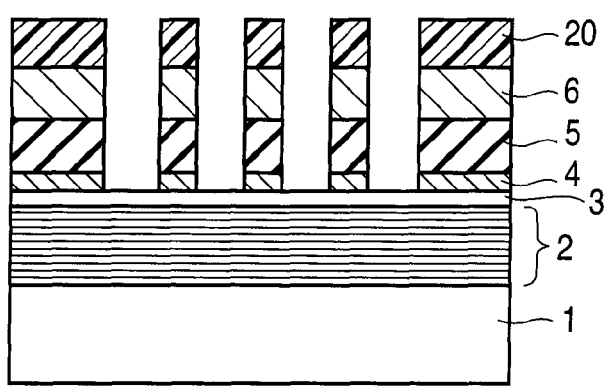
FIG. 5 is a sectional view showing the process of manufacturing the reflective-type mask of the second embodiment following FIG. 4.
Figure 6:
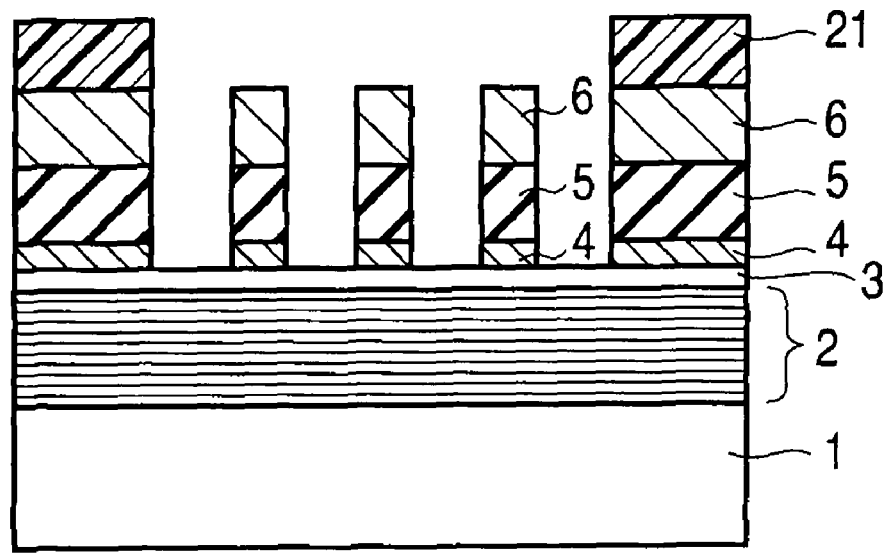
FIG. 6 is a sectional view showing the process of manufacturing the reflective-type mask of the second embodiment following FIG. 5.
Figure 7:
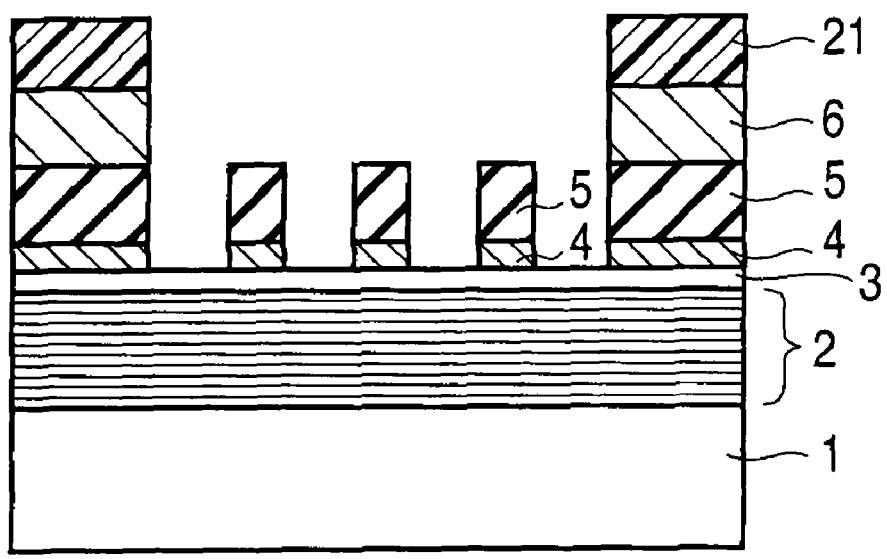
FIG. 7 is a sectional view showing the process of manufacturing the reflective-type mask of the second embodiment following FIG. 6.

FIG. 2 is a sectional view of the reflective-type mask taken along line 2-2 of FIG. 1.

In FIG. 2, numeral 1 indicates a low expansion coefficient substrate. The low expansion coefficient substrate 1 is typically a quartz substrate in which titanium is added. On the low expansion coefficient substrate 1, there is provided a multilayer reflective film 2 which reflects The EUV light 40. Here, the multilayer reflective film 2 is a Mo/Si multilayer film formed by stacking a Mo film and a Si film alternately. The top layer of the Mo/Si multilayer film is a Mo film. The Mo film is liable to be oxidized when the Mo film is exposed to the atmosphere. When the Mo film is oxidized, its reflectivity decreases. Therefore, a protective film 3 is provided on the multilayer reflective film 2. The protective film 3 also functions as an etching stopper as described later. Here, the protective film 3 is a Si film.

On the protective film 3 in the transfer pattern region 10, there is provided an absorber (a first absorber pattern) which includes a stacked structure of a patterned buffer film 4 and a first patterned absorption film 5 that absorbs EUV light 40. Here, the buffer film 4 is a Cr film and the first absorption film 5 is a TaN film. The first absorber pattern has a shape corresponding to a pattern to be formed on the wafer.

On the other hand, on the protective film 3 in the light shielding region 11, there is provided an absorber (a second absorber pattern) which includes a stacked structure of a patterned buffer film 4, a first patterned absorption film 5, and a second patterned absorption film 6 that absorbs EUV light 40. The first absorption film 5 in the light shielding region 11 and the first absorption film 5 in the transfer pattern region 10 have the same thickness. Here, the second absorption film 6 is a Cr film. The second absorber pattern has a shape corresponding to the light shielding region 11.

The light shielding region 11 includes the second absorption film 6, whereas the transfer pattern region 10 does not include the second absorption film 6. The light shielding region 11 can be made thicker than the transfer pattern region 10 by the thickness of the second absorption film 6. Accordingly, even if the first absorption film 5 is thinned to the extent that the shadowing effect of EUV light 40 on the transfer pattern region 10 is alleviated, a reflective-type mask can be realized which enables not only the leakage of EUV light 40 from the part where adjacent shots overlap to be suppressed but also the shadowing effect of EUV light 40 to be alleviated by thickening the second absorption film 6 in the light shielding region 11 to the extent that the leakage of EUV light 40 from the part where adjacent shots overlap can be suppressed.

FIGS. 3 to 17 are sectional views for explaining a method of manufacturing a reflective-type mask of the first embodiment.

[FIG. 3]

A reflective-type mask blanks is formed by forming a multilayer reflective film 2, a protective film 3, a buffer film 4, a first absorption film 5, and a second absorption film 6 sequentially on the low expansion coefficient substrate 1. Instead of using the reflective-type mask blanks formed as described above, purchased reflective-type mask blanks may be used.

[FIG. 4]

On the reflective-type mask blanks, that is, on the second absorption film 6, resist to be a resist pattern 20 is applied, thereafter, the resist is patterned by electron beam exposure and development, thereby the resist pattern 20 is formed.

[FIG. 5]

Using the resist pattern 20 as a mask, the second absorption film 6, first absorption film 5, and buffer film 4 are processed by RIE (Reactive Ion Etching) process. At this time, since the protective film 3 functions as an etching stopper, the multilayer reflective film 2 is not etched. In this way, in the light shielding region, an absorber (a second absorber pattern) which includes a stacked structure of the patterned buffer film 4, first patterned absorption film 5, and second patterned absorption film 6 is formed.

[FIG. 6]

After the resist pattern 20 is removed, a resist pattern 21 is formed by performing application of resist, drawing and development again. The resist pattern 21 is formed so as to selectively cover the top surface of the second absorption film 6 in the light shielding region. The drawing is, for example, laser drawing. The reason is that the resist pattern 21 is not required to have as high a dimensional accuracy as the resist pattern 20. Since the resist pattern 20 includes a pattern corresponding to a pattern to be formed on the wafer, it requires to have high dimensional accuracy. On the other hand, the resist pattern 21, however, includes no pattern required to have such high accuracy.

[FIG. 7]

Using the resist pattern 21 as a mask, the second absorption film 6 in the transfer pattern region is selectively removed by RIE process. In this way, in the transfer pattern region, an absorber (a first absorber pattern) which includes a stacked structure of the patterned buffer film 4 and first patterned absorption film 5 is formed.

Thereafter, the resist pattern 21 is removed, thereby completing the reflective-type mask blanks shown in FIG. 2.

While in the reflective-type mask manufacturing method, the second absorption film 6 in the transfer pattern region is removed (see FIG. 7) after the buffer film 4 is processed (see FIG. 5), the buffer film 4 may be processed after the second absorption film 6 in the transfer pattern region is removed.

Figure 8:
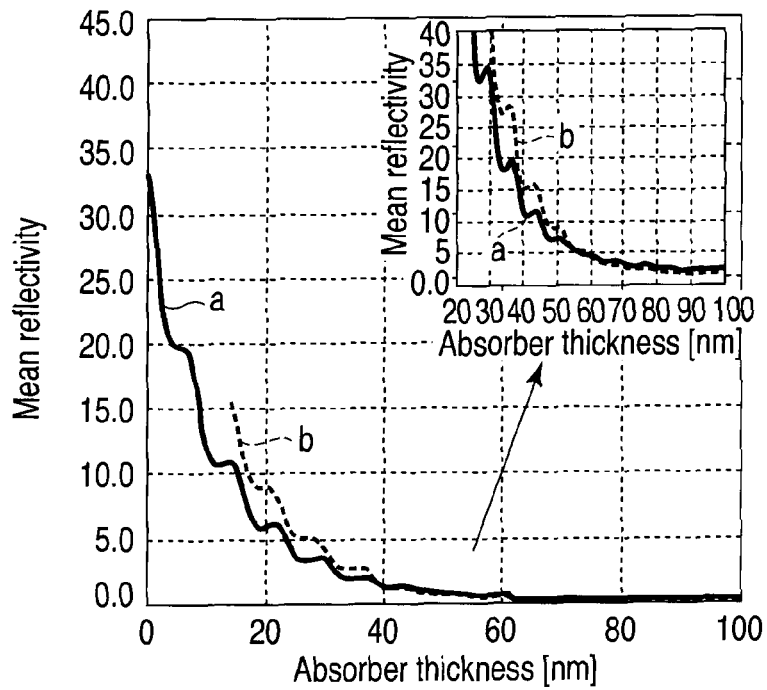
FIG. 8 shows the relationship between the thickness and mean reflectivity of the absorber of the reflective-type mask.
Figure 9:
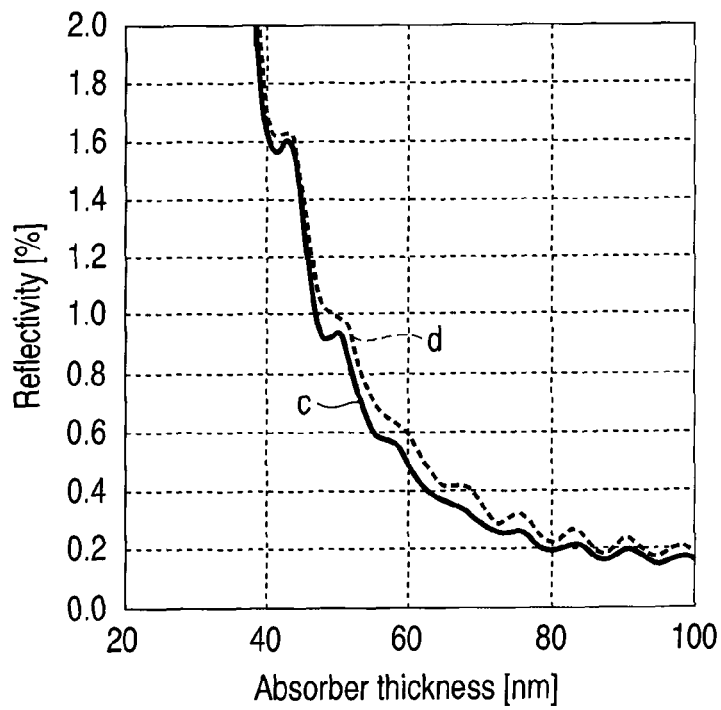
FIG. 9 shows the relationship between the thickness and mean reflectivity of the absorber of the reflective-type mask.

FIGS. 8 and 9 show the relationship between the thickness and mean reflectivity of the absorber of the reflective-type mask.

Characteristic curve a in FIG. 8 shows the dependence of the mean reflectivity of an absorber (first absorption film 5) on its thickness in the exposure wavelength range of 13.5 nm±0.3 nm when a Cr film (whose thickness is fixed to 10 nm) is used as the buffer film 4, a TaN film is used as the first absorption film 5, and the thickness of the TaN film is varied. 40 pairs of Mo film (2.8 nm thick)/Si film (4.2 nm thick) are used as the multilayer reflective film 2.

Characteristic curve b in FIG. 8 shows the dependence of the mean reflectivity of an absorber (first absorption film 5) on its thickness in the exposure wavelength range of 13.5 nm±0.3 nm when a Cr film (whose thickness is fixed to 10 nm) is used as the buffer film 4, a TaN film is used as the first absorption film 5, an antireflective film (here, a $Ta_2O_5$ film whose thickness is fixed to 14 nm) for suppressing the reflectivity in an EUV inspection wavelength range in mask inspection is provided on the TaN film, and the thickness of the TaN film is varied. 40 pairs of Mo film (2.8 nm thick)/Si film (4.2 nm thick) are used as the multilayer reflective film 2.

Characteristic curve c in FIG. 9 shows the dependence of the mean reflectivity of an absorber (first absorption film 5+antireflective film) on its thickness in the exposure wavelength range of 13.5 nm±0.3 nm when a Cr film (whose thickness is fixed to 10 nm) is used as the buffer film 4, a TaN film is used as the first absorption film 5, an antireflective film (here, a $Ta_2O_5$ film whose thickness is fixed to 14 nm) for suppressing the reflectivity in an EUV inspection wavelength range in mask inspection is provided on the TaN film, and the thickness of the TaN film is varied.

Characteristic curve d in FIG. 9 shows the dependence of the mean reflectivity of an absorber (buffer film 4, first absorption film 5, antireflective film, second absorption film 6) on its thickness in the exposure wavelength range of 13.5 nm±0.3 nm when a Cr film (whose thickness is fixed to 10 nm) is used as the buffer film 4, a TaN film (whose thickness is fixed to 23.5 nm) is used as the first absorption film 5, an antireflective film (here, a $Ta_2O_5$ film whose thickness is fixed to 14 nm) for suppressing the reflectivity in an EUV inspection wavelength range in mask inspection is provided on the TaN film, a Cr film is provided as the second absorption film 6 on the antireflective film, and the thickness of the Cr film is varied. 40 pairs of Mo film/Si film (2.8 nm/4.2 nm) are used as the multilayer reflective film 2.

It is seen from FIG. 8 that the first absorption film 5 (TaN film) has to have a thickness of 60 nm or more to secure a reflectivity of less than 0.5% without using the second absorption film 6. The absorber (buffer film 4+first absorption film 5) need to have a thickness of 70 nm or more.

On the other hand, it is seen from FIG. 9 that, to secure a reflectivity of less than 0.5% using the first absorption film 5 (TaN film), antireflective film ($Ta_2O_5$ film), and second absorption film 6 (Cr film), the total thickness of these three films need to be 63 nm or more. The absorber (buffer film 4+first absorption film 5+antireflective film+second absorption film 6) need to have a thickness of 73 nm or more.

Figure 10:
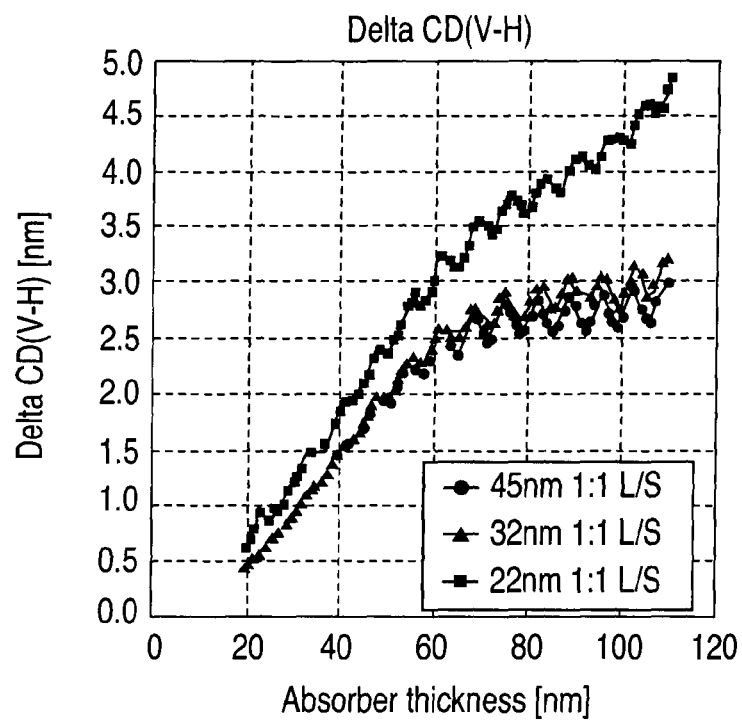
FIG. 10 shows the relationship between the thickness and ΔCD (V-H) of the absorber of the reflective-type mask.
Figure 38:
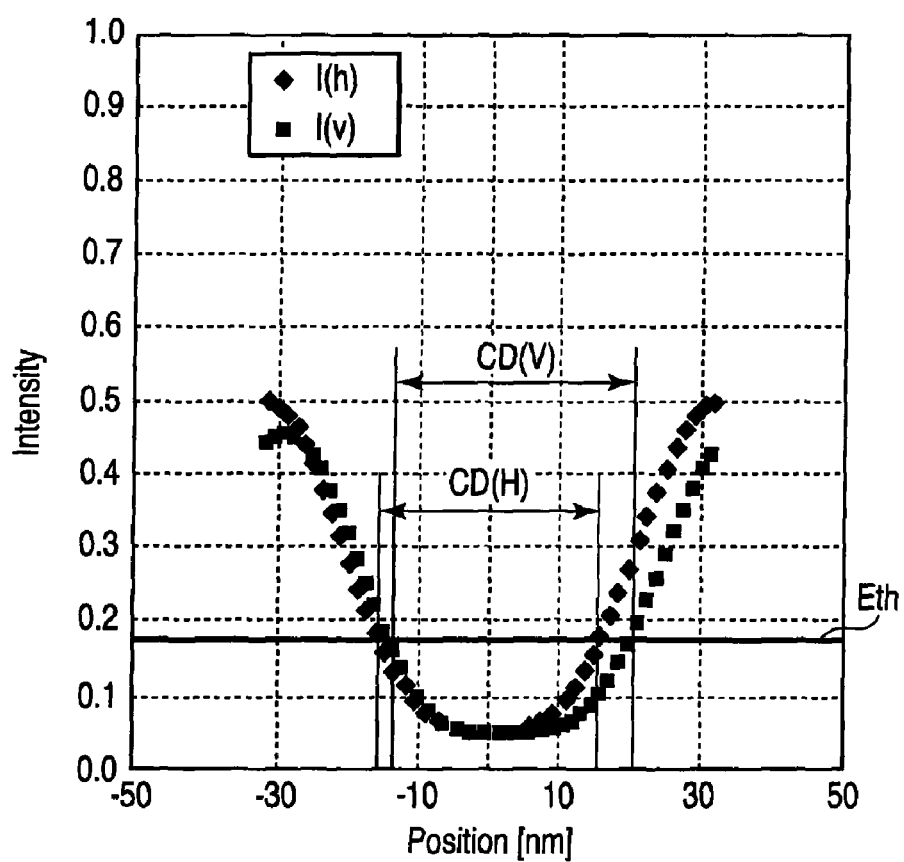
FIG. 38 shows the way to determine the transfer dimensions of a vertical pattern and a horizontal pattern.
Figure 39A:
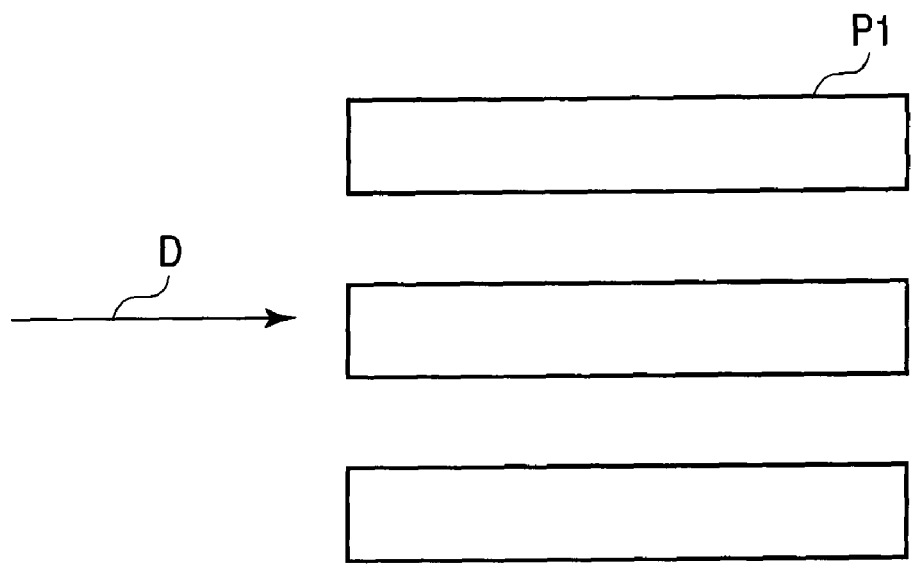
FIGS. 39A and 39B are plan views of examples of patterns differing in the degree of shadowing effect.
Figure 39B:
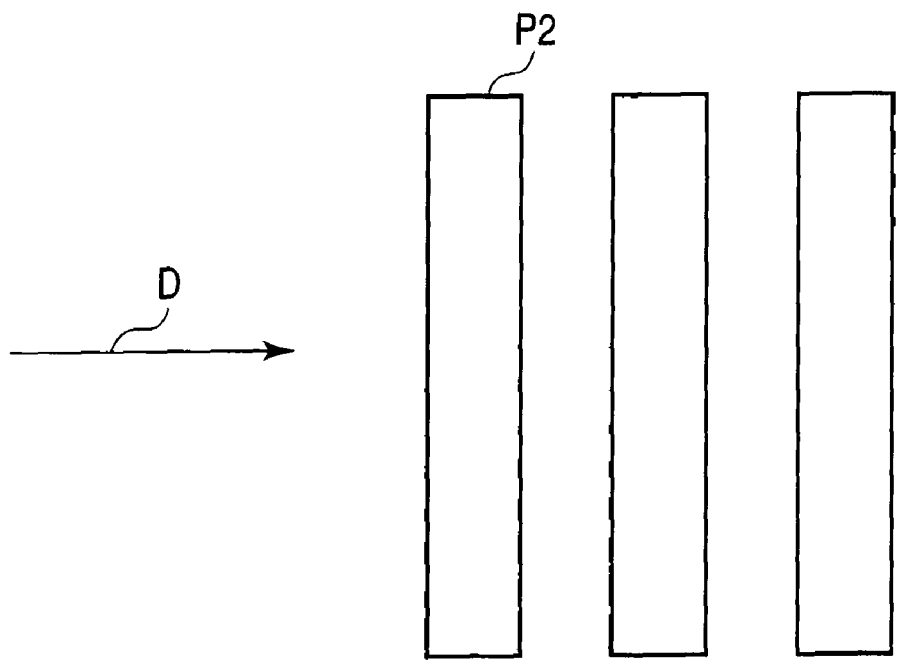

FIG. 10 shows the relationship between the thickness and $\Delta CD$ (V-H) of the absorber of the reflective-type mask. The absorber is a stacked film of a TaN film (whose thickness is variable) and a $Ta_2O_5$ film (whose thickness is fixed to 14 nm). In addition, $\Delta CD$ (V-H) is a value obtained by subtracting the transfer dimensions of an L&S pattern (horizontal pattern) whose direction parallel to the incident direction of the EUV light is a longitudinal direction from the transfer dimensions of an L&S pattern (vertical pattern) whose direction perpendicular to the incident direction of the EUV light is a longitudinal direction. The transfer dimensions (CD values) of the vertical pattern and horizontal pattern are calculated from the light intensity distribution of an exposure transferred image of the vertical pattern and horizontal pattern, and the exposure amount threshold value (the exposure amount required for the resist to be developed) (refer to FIG. 38). In FIG. 38, Eth indicates an exposure amount threshold value, I (v) indicates a light intensity distribution of an exposure transferred image of the vertical pattern, I (h) indicates a light intensity distribution of an exposure transferred image of the horizontal pattern, CD (v) indicates a DC value of the vertical pattern, and CD (h) indicates a DC value of a horizontal patter.

Figure 11:
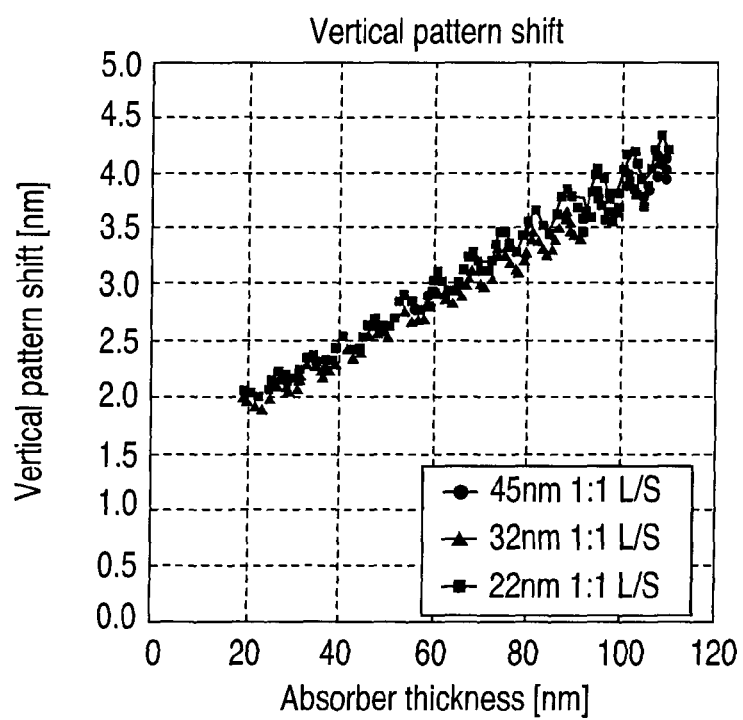
FIG. 11 shows the relationship between the thickness of the absorber of the reflective-type mask and the shift amount of the pattern center position of an exposure transferred image of a vertical pattern.

FIG. 11 shows the relationship between the thickness of the absorber of the reflective-type mask and the shift amount of the pattern center position of an exposure transferred image of the vertical pattern.

FIGS. 10 and 11 show the result of measuring three L&S patterns with a pitch of 22 nm, a pitch of 32 nm, and a pitch of 45 nm. In addition, the exposure conditions is, the numeric aperture NA=0.3, the coherence factor σin/σout=0.3/0.7, the wavelength λ=13.5 nm, the incident angle=6 degrees, and the mask magnification=×5.

It is seen from FIGS. 10 and 11 that, the thinner the absorber, the smaller the difference in dimensions between the horizontal pattern and vertical pattern and therefore the smaller the shift amount of the pattern center position of the vertical pattern. That is, as the absorber becomes thinner, the shadowing effect becomes less, which is advantageous to wafer transfer.

Figure 12:
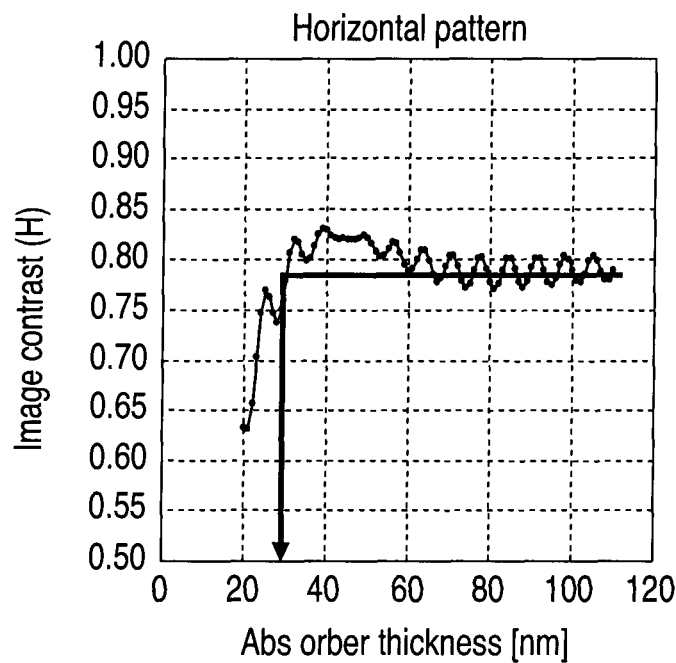
FIG. 12 shows the relationship between the thickness of the absorber of the reflective-type mask and the image contrast of L&S pattern (horizontal pattern)
Figure 13:
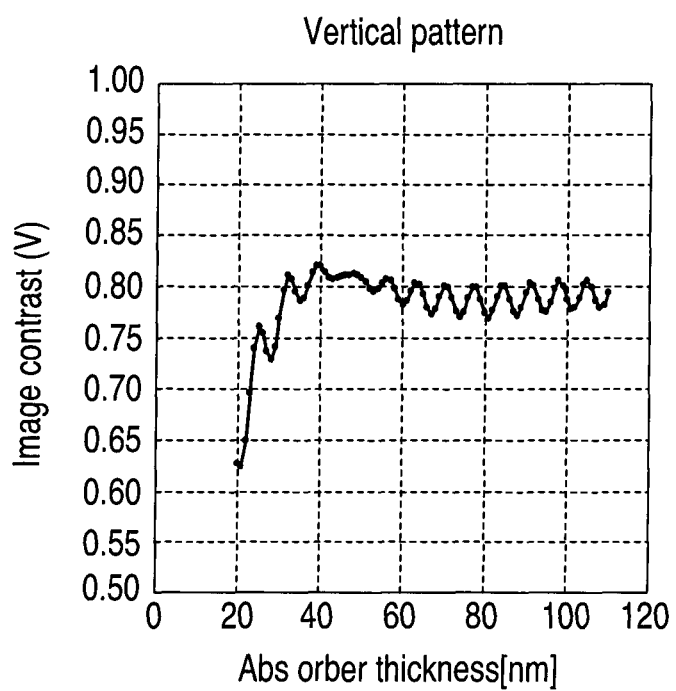
FIG. 13 shows the relationship between the thickness of the absorber of the reflective-type mask and the image contrast of L&S pattern (vertical pattern)

FIG. 12 shows the relationship between the thickness of the absorber of the reflective-type mask and the image contrast of an L&S pattern (horizontal pattern). FIG. 13 shows the relationship between the thickness of the absorber of the reflective-type mask and the image contrast of an L&S pattern (vertical pattern). In FIGS. 12 and 13, the pitch of the L&S pattern is 32 nm. In addition, if the maximum value of an exposure transferred image (light intensity distribution) of the L&S pattern is Imax and its minimum value is Imin, the image contrast is expressed as (Imax−Imin)/(Imax+Imin).

A higher image contrast is more advantageous to wafer transfer, however, from FIGS. 12 and 13, it is seen that, if the thickness of the absorber (not including the buffer film) is 30 nm or more, the necessary image contrast is obtained.

As described above, the thinner the absorber, the less the shadowing effect. However, the thickness of the absorber decreases below a certain value, the image contrast lowers, which is disadvantageous to wafer transfer. Therefore, it is necessary to determine the thickness of the absorber in the transfer pattern region suitably, taking the image contrast into account. For example, the absorber in the transfer pattern region is set to 38 nm in thickness. When the thickness of the absorber is 38 nm, it is seen from FIG. 8 that its reflectivity is 3%, however, the absorber is not used in the light shielding region, there is no problem. On the other hand, the thickness of the absorber in the light shielding region is selected such a value that the leaked light is sufficiently suppressed, for example, a thickness that achieve reflectivity less than 0.5% is selected.

Third Embodiment

Figure 14:
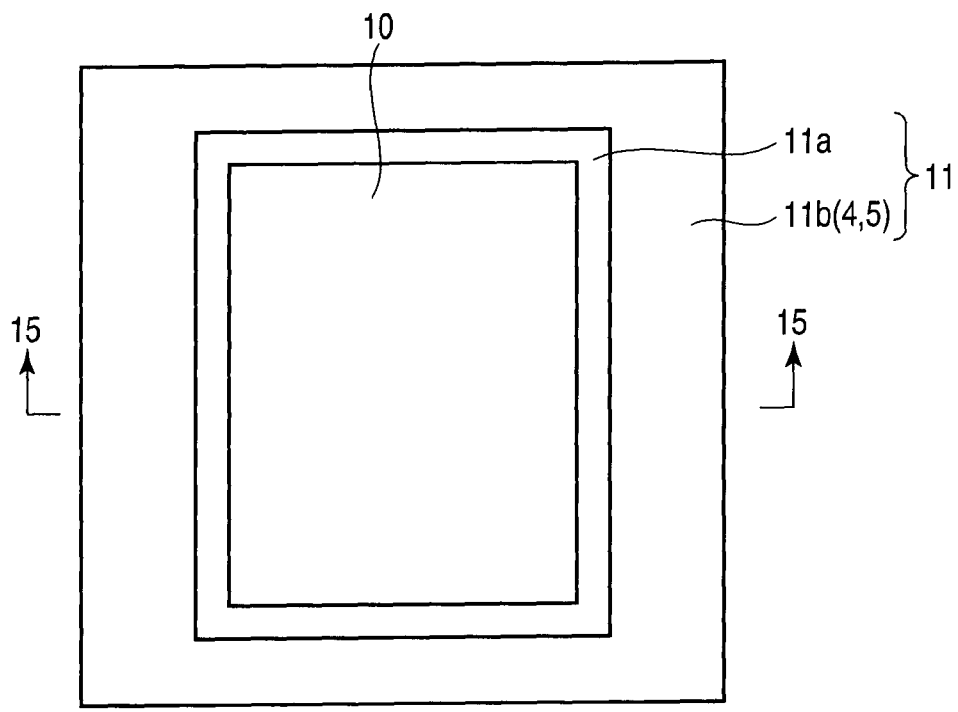
FIG. 14 is a plan view showing a reflective-type mask according to a third embodiment.
Figure 15:
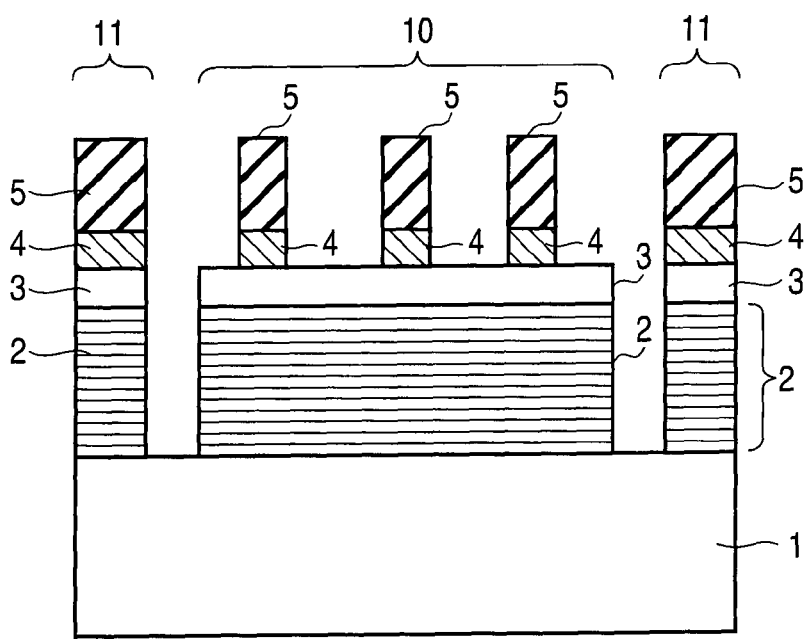
FIG. 15 is a sectional view of the reflective-type mask taken along line 14-14 of FIG. 14.

FIG. 14 is a plan view of a reflective-type mask according to a third embodiment. FIG. 15 is a sectional view of the reflective-type mask taken along line 14-14 of FIG. 14.

The parts corresponding to those in the above drawings are indicated by the same reference numerals and a detailed explanation of them will be omitted (hereinafter, the same holds true).

The present embodiment differs from the second embodiment in that the surface of the low expansion coefficient substrate 1 around the transfer pattern region 10 is exposed, and the exposed surface of the low expansion coefficient substrate 1 is used to suppress the leakage of the EUV light from a part where adjacent shots overlap.

The light shielding region 11 of the present embodiment includes a first light shielding region 11a provided along the periphery of transfer pattern region 10 and having a closed beltlike shape whose inner and outer circumferences are both rectangular, and a second light shielding region lib provided along the periphery of first light shielding region 11a having a closed beltlike shape whose inner and outer circumferences are both rectangular. The first light shielding region 11a comprises the low expansion coefficient substrate whose surface 1 is exposed, and the second light shielding region lib comprises a stacked film of the buffer film 4 and absorption film 5.

Figure 16:
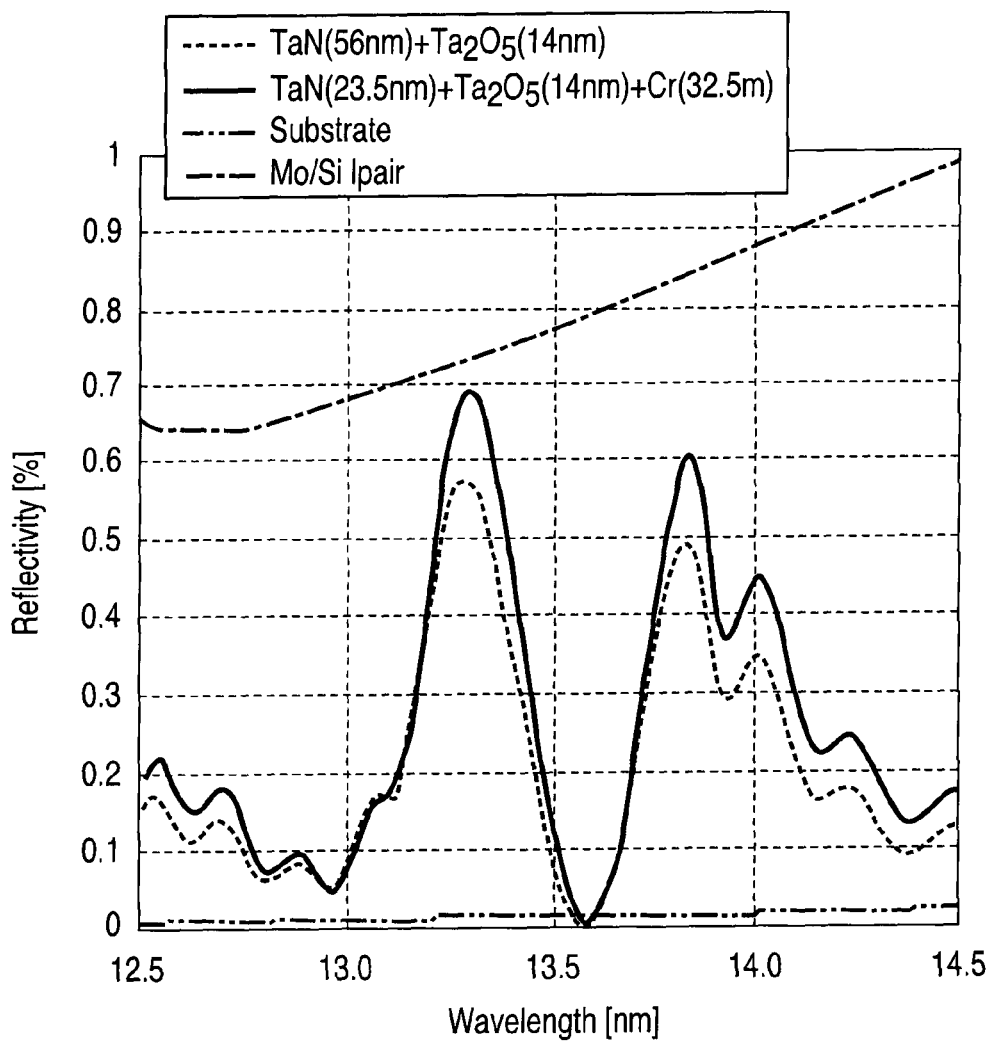
FIG. 16 shows an EUV light reflectivity characteristic of a quartz substrate.
Figure 17:
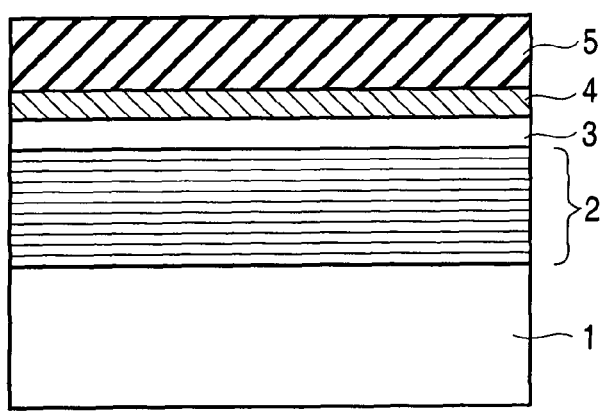
FIG. 17 is a sectional view showing a process of manufacturing a reflective-type mask of the third embodiment.
Figure 18:
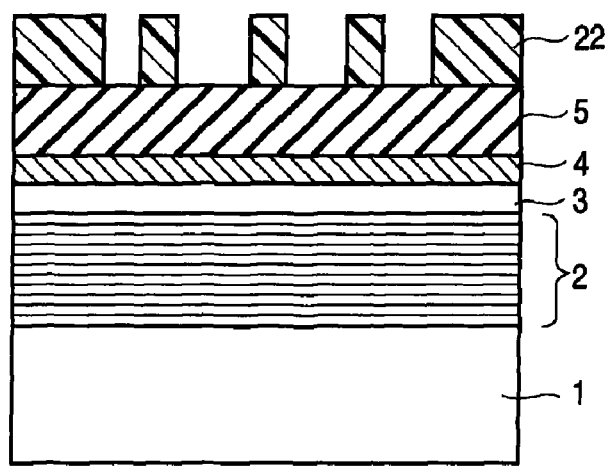
FIG. 18 is a sectional view showing the process of manufacturing the reflective-type mask of the third embodiment following FIG. 17.
Figure 19:
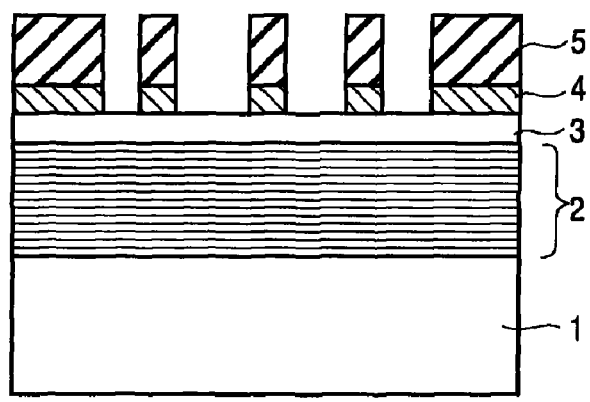
FIG. 19 is a sectional view showing the process of manufacturing the reflective-type mask of the third embodiment following FIG. 18.
Figure 20:
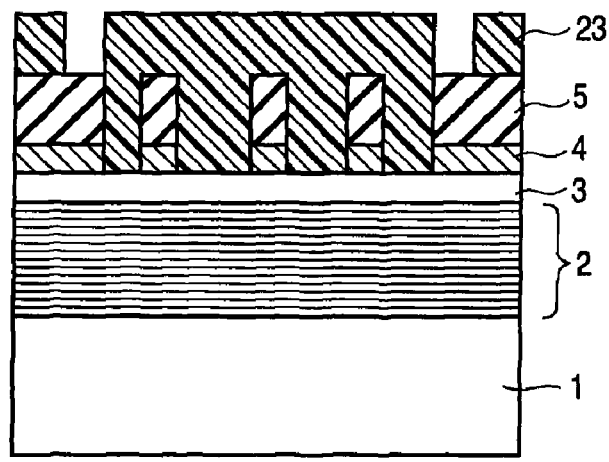
FIG. 20 is a sectional view showing the process of manufacturing the reflective-type mask of the third embodiment following FIG. 19.
Figure 21:
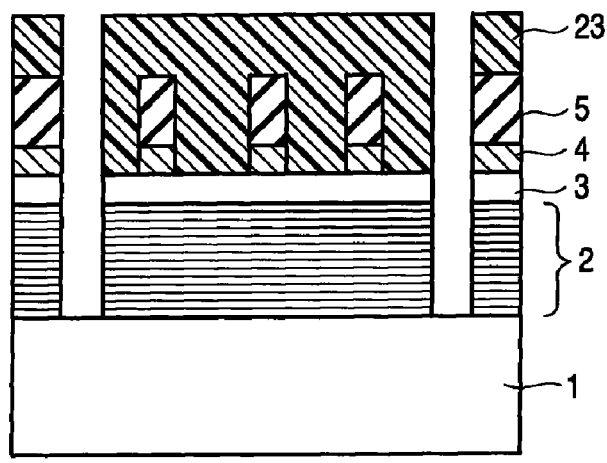
FIG. 21 is a sectional view showing the process of manufacturing the reflective-type mask of the third embodiment following FIG. 20.

FIG. 16 shows an EUV light reflectivity characteristic of a quartz substrate. For the purpose of reference, the EUV light reflectivity characteristics of an absorber (TaN (56 nm thick)+ $Ta_2O_5$ (14 nm thick)), an absorber (TaN (23.5 nm thick)+ $Ta_2O_5$ (14 nm thick)+Cr (32.5 nm thick)), and a multilayer reflective film (40 pairs of Mo film (2.8 nm thick)/S film (4.2 nm thick)) are also shown. It is seen from FIG. 16 that the EUV light reflectivity of the quartz substrate is sufficiently low and can be used as the absorber in the light shielding region 11.

Accordingly, the surface of the low expansion coefficient substrate 1 around the transfer pattern region 10 is exposed for use as the light shielding region 11a, in addition, as in the second embodiment, the absorption film 5 is thinned, which makes it possible to realize a reflective-type mask capable of not only suppressing the leakage of EUV light from a part where adjacent shots overlap but also alleviating the shadowing effect of EUV light.

While in the second embodiment, the reflectivity in the light shielding region 11 is decreased by the second absorption film 6, in the present embodiment, as the second absorption film 6 does not needed to be form, the mask manufacturing processes is simplified and the mask cost is lowered.

FIGS. 17 to 21 are sectional views for explaining a reflective-type mask manufacturing method of the present embodiment.

[FIG. 17]

A reflective-type mask blanks is formed by forming a multilayer reflective film 2, a protective film 3, a buffer film 4, and an absorption film 5 sequentially on the low expansion coefficient substrate 1. Instead of using the reflective-type mask blanks formed as described above, purchased reflective-type mask blanks may be used.

[FIG. 18]

On the reflective-type mask blanks, that is, on the absorption film 5, resist to be a resist pattern 22 is applied, thereafter, the resist pattern 22 is patterned by electron beam exposure and development, thereby the resist pattern 22 is formed.

[FIG. 19]

Using the resist pattern 22 as a mask, the absorption film 5 and buffer film 4 are processed by RIE process. At this time, since the protective film 3 functions as an etching stopper, the multilayer reflective film 2 is not etched. In this way, in the transfer pattern region, an absorber (a first absorber pattern) which includes a stacked structure of the patterned buffer film 4 and patterned absorption film 5 is formed.

[FIG. 20]

After the resist pattern 22 is removed, a resist pattern 23 is formed by performing application of resist, drawing and development again. The resist pattern 23 is formed so as to selectively cover the top surface of the second absorption film 5 in the light shielding region. The drawing is, for example, laser drawing.

[FIG. 21]

Using the resist pattern 23 as a mask, the absorption film 5, buffer film 4, protective film 3, and multilayer reflective film 2 in the light shielding region (a first light shielding region) around the transfer pattern region are selectively removed by RIE process, thereby exposing the surface of the low expansion coefficient substrate 1. In this way, in the first light shielding region, an absorber (a second absorber pattern) which comprises the exposed surface of the low expansion coefficient substrate 1 in the light shielding region around the transfer pattern region and a patterned buffer film 4/absorption film 5 is formed in the first light shielding region.

Thereafter, the resist pattern 23 is removed, thereby completing the reflective-type mask blanks shown in FIG. 15.

While in the reflective-type mask manufacturing method, the absorption film 5, buffer film 4, protective film 3, and multilayer reflective film 2 in the first light shielding region are processed (FIG. 21) after the buffer film 4 in the transfer pattern region is processed (see FIG. 19), the buffer film 4 in the transfer pattern region may be processed after the first absorption film 5, buffer film 4, protective film 3, and multilayer reflective film 2 in the first light shielding region are processed.

Fourth Embodiment

Figure 22:
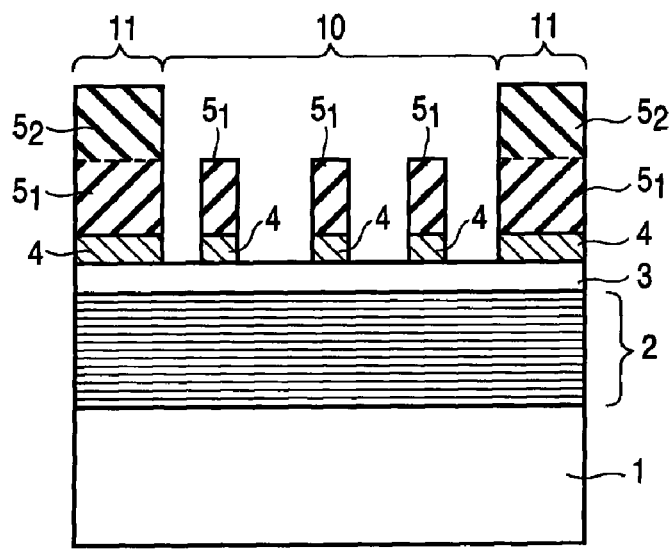
FIG. 22 is a sectional view showing a reflective-type mask according to a fourth embodiment.
Figure 23:
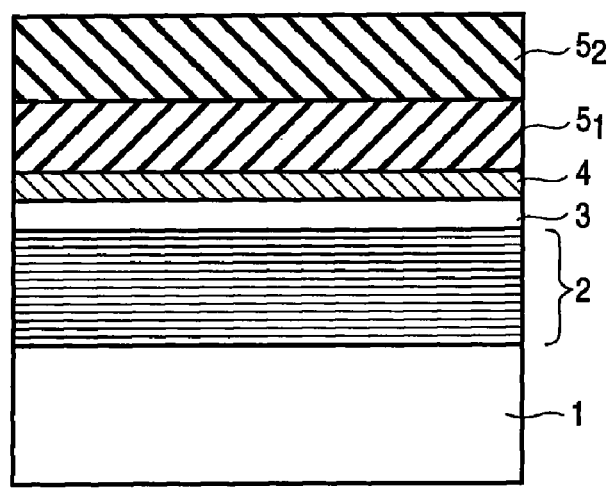
FIG. 23 is a sectional view showing a process of manufacturing the reflective-type mask of the fourth embodiment.

FIG. 22 is a sectional view of a reflective-type mask according to a fourth embodiment.

In the present embodiment, a case where an absorber made of the same material is used in both the transfer pattern region 10 and the light shielding region 11 will be explained. An absorption film $5_1$ in the transfer pattern region 10 is set to have a thickness that can suppress the shadowing effect. In addition, the total thickness of the absorption film $5_1$ and an absorption film $5_2$ in the light shielding region 11 is set to be a thickness that can suppress the leakage of EUV light from a part where adjacent shots overlap.

FIGS. 23 to 27 are sectional views for explaining a reflective-type mask manufacturing method of the present embodiment.

[FIG. 23]

A reflective-type mask blanks is formed by forming a multilayer reflective film 2, a protective film 3, a buffer film 4, an absorption film $5_1$, and an absorption film $5_2$ sequentially on the low expansion coefficient substrate 1.

Here, the multilayer reflective film 2 is a Mo/Si multilayer film. The buffer film has CrN as a main component. In addition, the absorption film $5_1$ and $5_2$ have TaN as a main component, furthermore, on the surface of the absorption film $5_2$ an antireflective film (not shown) having tantalum oxide as a main component and configured to suppress the reflectivity of in an EUV inspection wavelength range is formed. Instead of using the reflective-type mask blanks formed as described above, purchased reflective-type mask blanks may be used. Although an antireflective film has not been referred to in the explanation of the reflective-type mask manufacturing method in each of the first and second embodiments, an antireflective film may be formed in those manufacturing methods.

[FIG. 24]

On the reflective-type mask blanks, that is, on the absorption film $5_2$, resist to be a resist pattern 24 is applied, thereafter, the resist is patterned by electron beam exposure and development, thereby the resist pattern 24 is formed.

[FIG. 25]

Using the resist pattern 24 as a mask, the absorption films $5_1$ and $5_2$ are processed by RIE process. For example, the absorption films $5_2$ is processed by RIE process using chlorine-based gas as a main reactive gas, the antireflective film on the surface of the absorption films $5_1$ is processed by RIE process using fluorine-based gas as a main reactive gas, and the absorption films $5_1$ is processed by RIE process using chlorine-based gas as a main reactive gas.

[FIG. 26]

After the resist pattern 24 is removed, a resist pattern 25 is formed by performing application of resist, drawing and development again. The resist pattern 25 is formed selectively on the top surface of the absorption film $5_2$ in the light shielding region. The drawing is, for example, laser drawing.

[FIG. 27]

Using the resist pattern 25 as a mask, the absorption film $5_2$ in the transfer pattern region is selectively removed by RIE process. For example, the absorption film $5_2$ in the transfer pattern region is removed by RIE process using chlorine-based gas as a main reactive gas.

Thereafter, mask defects are inspected and corrected. Then, the buffer film 4 is processed, thereby completing the reflective-type mask blanks shown in FIG. 22.

Fifth Embodiment

Figure 28:
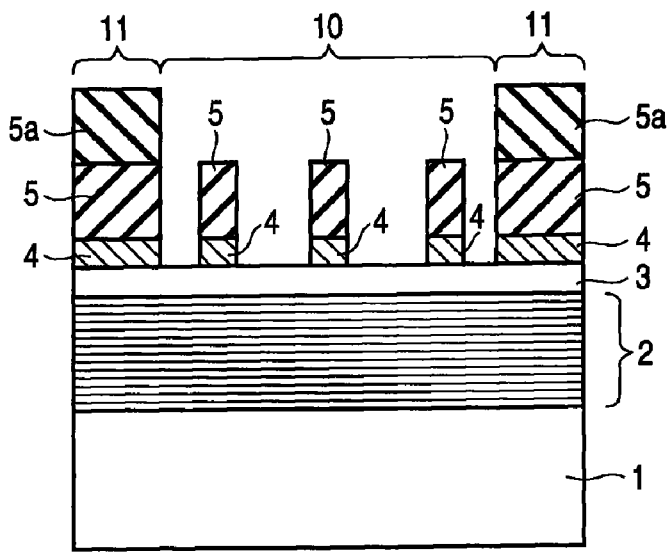
FIG. 28 is a sectional view showing a reflective-type mask according to a fifth embodiment.

FIG. 28 is a sectional view of a reflective-type mask according to a fifth embodiment.

In the present embodiment, as in the second embodiment, the material of absorption film in the transfer pattern region 10 differs from that in the light shielding region 11, however, the present embodiment differs from the second embodiment in the manufacturing processes. An absorption film 5a is provided in the light shielding region 11, whereas an absorption film 5a is not provided in the transfer pattern region 10.

FIGS. 29 to 33 are sectional views for explaining a reflective-type mask manufacturing method of the fifth embodiment.

[FIG. 29]

A multilayer reflective film 2, a protective film 3, a buffer film 4, and an absorption film 5 are sequentially formed on the low expansion coefficient substrate 1.

Here, the multilayer reflective film 2 is a Mo/Si multilayer film. The buffer film has CrN as a main component. In addition, the absorption film 5 has TaN as a main component, furthermore, on the surface of absorption film 5, an antireflective film (not shown) having tantalum oxide as a main component and configured to suppress the reflectivity of in an EUV inspection wavelength range is formed.

[FIG. 30]

Resist to be a resist pattern 26 is applied on the absorption film 5, thereafter, the resist is patterned by electron beam exposure and development, thereby the resist pattern 26 is formed.

[FIG. 31]

Using the resist pattern 26 as a mask, the absorption film 5 is processed by RIE process. For example, the antireflective film on the surface of absorption film 5 is processed by RIE process using fluorine-based gas as a main reactive gas. The absorption film 5 is processed by RIE process using chlorine-based gas as a main reactive gas.

[FIG. 32]

After the resist pattern 26 is removed, a resist pattern 27 is formed by performing application of resist, drawing and development again. The resist pattern 27 is formed such that the region where absorption film 5a in the light shielding region is to be formed is selectively exposed. The drawing is, for example, laser drawing.

[FIG. 33]

An absorption film 5a is deposited on the entire surface. Here, the absorption film 5a is a Pt film.

Next, the resist pattern 27 is removed by wet cleaning or the like, thereby the unnecessary absorption film 5a is removed. Thereafter, mask defects are inspected and corrected, and the buffer film 4 are processed, thereby completing the reflective-type mask shown in FIG. 28.

Sixth Embodiment

Figure 34:
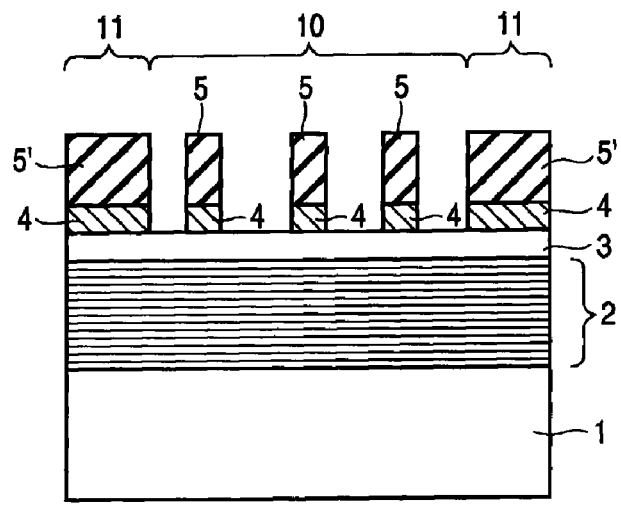
FIG. 34 is a sectional view showing a process of manufacturing a reflective-type mask according to a sixth fourth embodiment.

FIG. 34 is a sectional view of a reflective-type mask according to a sixth embodiment.

In the present embodiment, a case where an absorption film 5' in the light shielding region 11 is formed by modification process will be explained.

Figure 35:
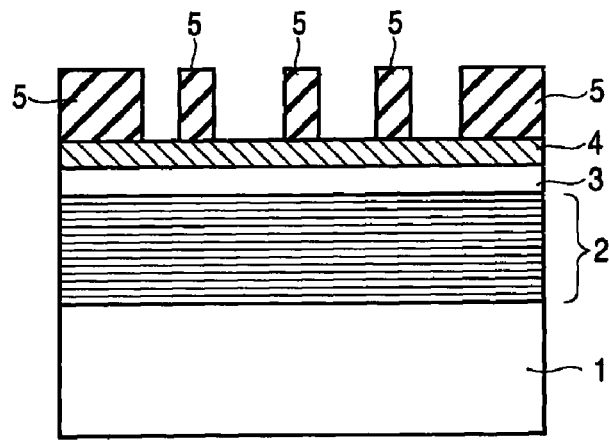
FIG. 35 is a sectional view showing the process of manufacturing the reflective-type mask of the sixth embodiment.
Figure 36:
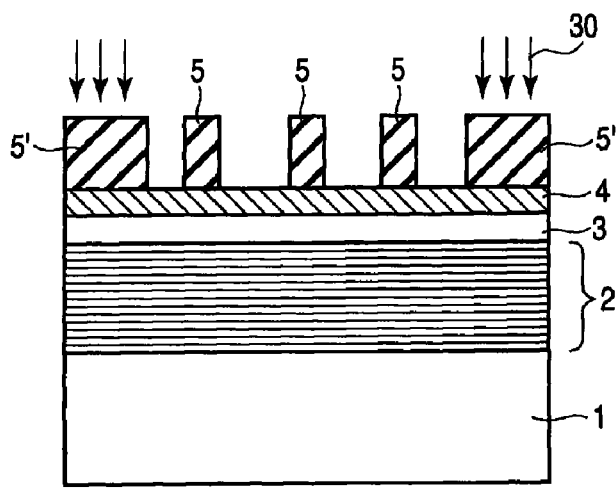
FIG. 36 is a sectional view showing the process of manufacturing the reflective-type mask of the sixth embodiment following FIG. 35.
Figure 37:
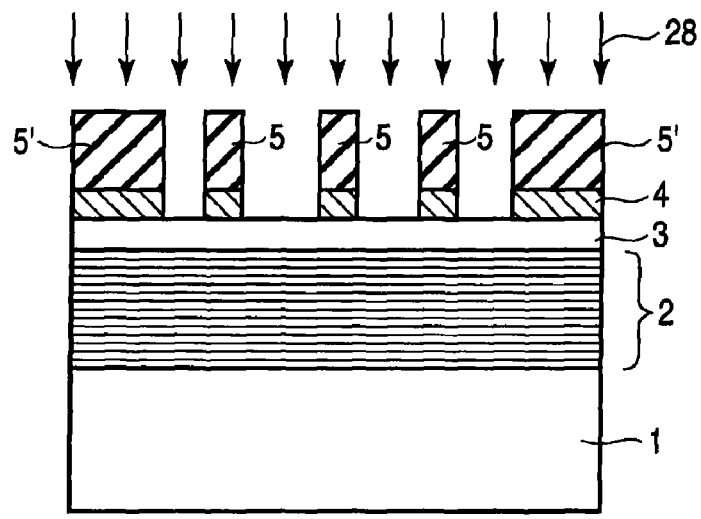
FIG. 37 is a sectional view showing the process of manufacturing the reflective-type mask of the sixth embodiment following FIG. 36.

FIGS. 35 to 37 are sectional views for explaining a reflective-type mask manufacturing method of the present embodiment.

[FIG. 35]

Figure 29:
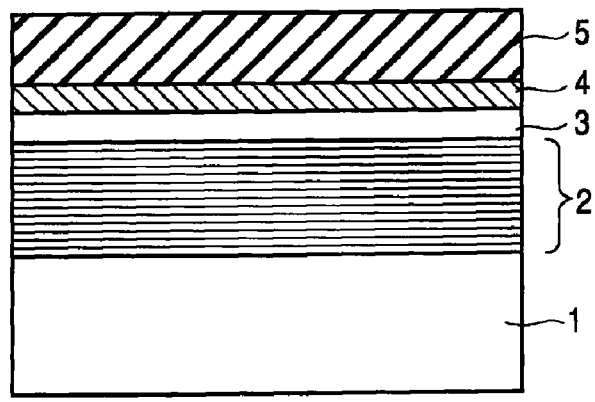
FIG. 29 is a sectional view showing the process of manufacturing the reflective-type mask of the fifth embodiment following FIG. 28.
Figure 30:
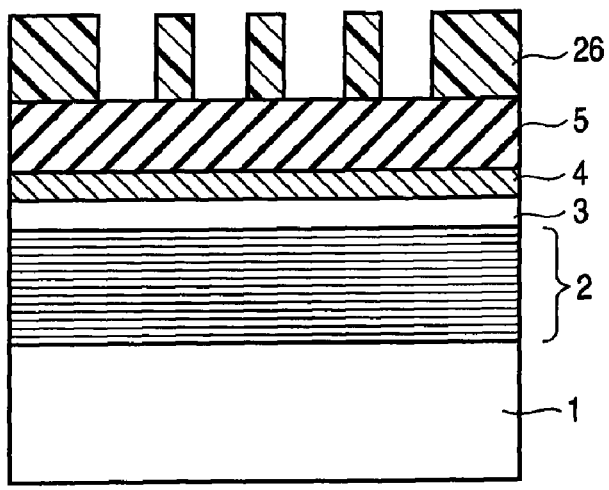
FIG. 30 is a sectional view showing the process of manufacturing the reflective-type mask of the fifth embodiment following FIG. 29.
Figure 31:
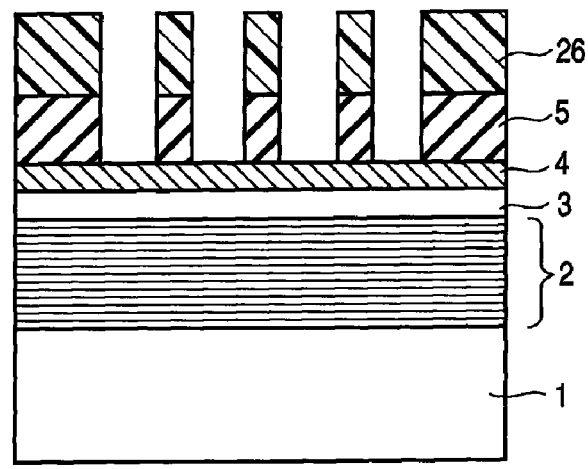
FIG. 31 is a sectional view showing the process of manufacturing the reflective-type mask of the fifth embodiment following FIG. 30.
Figure 32:
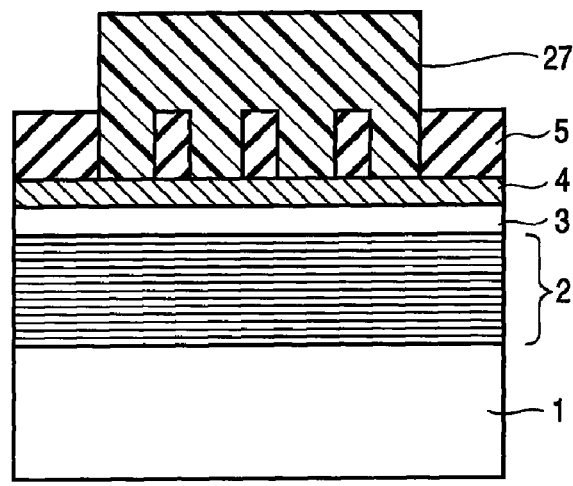
FIG. 32 is a sectional view showing the process of manufacturing the reflective-type mask of the fifth embodiment following FIG. 31.
Figure 33:
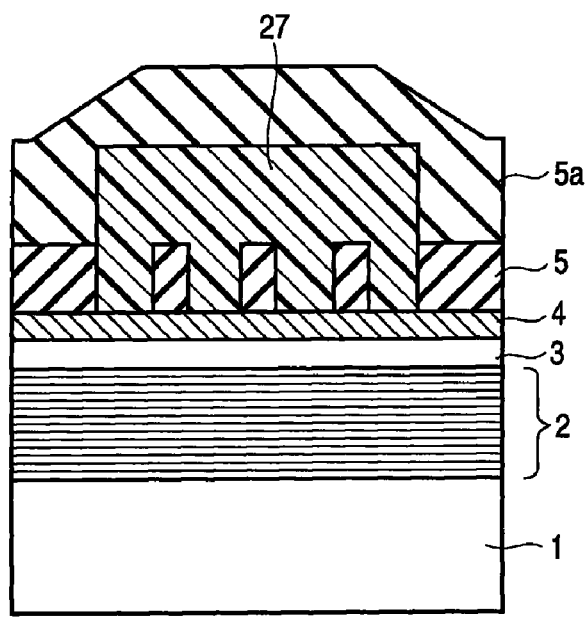
FIG. 33 is a sectional view showing the process of manufacturing the reflective-type mask of the fifth embodiment following FIG. 32.

The steps in FIGS. 29 to 31 explained in the fifth embodiment are performed, thereafter, the resist pattern 26 is removed.

[FIG. 36]

An absorption film in the light shielding region is selectively irradiated with laser light 30, thereby the absorption film in the light shielding region is modified into an absorption film 5' whose reflectivity is lower than that of the absorption film 5 in the transfer pattern region. The reason why the absorption film is modified by laser irradiation is that the density or the like of the absorption film can be changed by optimizing laser power or the like.

[FIG. 37]

After mask defects are inspected and corrected, the entire surface of the absorption films 5, 5' is etched by RIE process on the condition that the buffer film 4 can be selectively etched, thereby the buffer film 4 is processed. In FIG. 37, numeral 28 indicates reactive ions. The condition is that, for example, a mixed gas of chlorine and oxygen is used as a source gas. By using such a source gas, the buffer film 4 can be processed without causing etching damage to the absorption films 5, 5'.

According to the present embodiment, the absorption film 5 is formed in the transfer and light shielding regions 10 and 11, and the absorption film 5 in the light shielding region 11 is selectively modified to form an absorption film 5' having reflectivity lower than that of the absorption film 5, so that the number of lithography processes (the number of patterning steps of absorption film) is decreased. Thereby the mask manufacturing processes is further simplified. In addition, the mask cost is further lowered.

Next, a method of manufacturing a semiconductor device of the present embodiment will be explained.

First, resist is applied onto a substrate (a substrate to be processed) including a semiconductor substrate. The semiconductor substrate is, for example, a silicon substrate or an SOI substrate.

Next, above the substrate, any one of the reflective-type masks described in the embodiments is provided. The resist is irradiated with EUV light reflected by the reflective-type mask. Thereafter, development and others are performed to form a resist pattern.

Next, with the resist pattern as a mask, the substrate is etched to form a micropattern. Thereafter, the resist pattern is removed.

Here, when the underlying film of the resist (the top layer of the substrate) is a polysilicon film or a metal film, a microscopic electrode pattern, a wiring pattern or the like is formed. When the underlying film of the resist (the top layer of the substrate) is an insulating film, a microscopic contact hole pattern, a gate insulating film or the like is formed. When the underlying layer of the resist is the semiconductor substrate, microscopic isolation trench (STI) or the like is formed.

The application of resist, the formation of resist pattern, and the etching of the substrate to be processed are repeated in the same manner as described above to form the necessary pattern, so that a semiconductor device is manufactured.

The invention is not limited to the above embodiments.

For example, while in the second to sixth embodiments, the light shielding region is provided along the periphery of the transfer pattern region, the light shielding region may be provided in the transfer pattern region. One example is a light shielding region provided in a transfer pattern region corresponding to the dicing lines on a wafer.

Furthermore, while in the second to sixth embodiments, the material of the protective film 3 differs from that of the buffer film 4, material having functions both of protective film and buffer film, such as ruthenium (Ru), may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A reflective-type mask including a main surface to be irradiated with exposure light, comprising:

a pattern region provided in the main surface, the pattern region comprising a multilayer reflective film configured to reflect the exposure light and a first absorber pattern provided on the multilayer reflective film, the first absorber pattern including a pattern which is configured to absorb the exposure light and corresponds to a pattern to be formed on a wafer; and a light shielding region provided in the main surface and configured to prevent a region on the wafer excluding a predetermined region from being irradiated with the exposure light when the main surface is irradiated with the exposure light for transferring the first absorber pattern to the predetermined region on the wafer, the light shielding region comprising a second absorber pattern, the second absorber pattern having a lower reflectivity to the exposure light than the first absorber pattern and being provided in a position differing from a position in which the first absorber pattern is provided, wherein the multilayer reflective film is formed on a substrate whose reflectivity to the exposure light is lower than that of the first absorber pattern, and the second absorber pattern comprises an exposed surface of the substrate.

2. The reflective-type mask according to claim 1, wherein the light shielding region is provided along a periphery of the pattern region or in a region corresponding to a dicing line on the wafer.

3. The reflective-type mask according to claim 1, wherein the exposure light is EUV light.

4. The reflective-type mask according to claim 1, wherein the first absorber pattern includes TaN as material.

5. The reflective-type mask according to claim 1, further comprising an antireflective film which is provided on a surface of the first absorption pattern and is configured to prevent light used for mask inspection from reflecting.

6. The reflective-type mask according to claim 5, wherein the antireflective film includes $Ta_2O_5$ as material.

7. The reflective-type mask according to claim 5, further comprising a buffer film provided under the first absorption pattern.

8. The reflective-type mask according to claim 7, wherein the buffer film includes Cr as material.

9. The reflective-type mask according to claim 1, wherein the main surface is a surface of quartz substrate.

10. The reflective-type mask according to claim 1, wherein the quartz substrate includes titanium.

* * * * *